(12) United States Patent
Lee

(10) Patent No.: US 6,950,370 B2
(45) Date of Patent: Sep. 27, 2005

(54) SYNCHRONOUS MEMORY DEVICE FOR PREVENTING ERRONEOUS OPERATION DUE TO DQS RIPPLE

(75) Inventor: Sang-Hee Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/737,230

(22) Filed: Dec. 16, 2003

(65) Prior Publication Data

US 2004/0218460 A1 Nov. 4, 2004

(30) Foreign Application Priority Data

Apr. 30, 2003 (KR) ................................ 10-2003-0027711

(51) Int. Cl.[7] ................................................. G11C 8/00
(52) U.S. Cl. .............. 365/233; 365/189.05; 365/230.08
(58) Field of Search ........................... 365/233, 189.05, 365/230.08, 207, 189.02, 230.02

(56) References Cited

U.S. PATENT DOCUMENTS 6,237,052 B1    5/2001   Stolowitz 6,320,819 B2 *  11/2001  Tomita et al. .............. 365/233
2003/0128620 A1  7/2003   Nakazato

FOREIGN PATENT DOCUMENTS

JP    01-103016    4/1989
JP    01-276486    11/1989
JP    06-290586    10/1994

* cited by examiner

*Primary Examiner*—David Lam
(74) *Attorney, Agent, or Firm*—Blakely, Sokoloff, Taylor & Zafman

(57) ABSTRACT

A synchronous memory device, receiving a number of data in synchronization with a rising edge and a falling edge of a clock, includes a data strobe buffering unit, a data align latching unit and a DQS signal controlling unit. The data strobe buffering unit outputs a rising pulse and a falling pulse for detecting a rising edge and a falling edge of a DQS signal that sustains a high impedance state when there is no operation and is clocked while the data is inputted. The data align latching unit latches and aligns the data in synchronization with the rising pulse and the falling pulse. The DQS signal controlling unit controls the data strobe buffering unit to output the rising pulse and the falling pulse to the data align latching unit only when the DQS signal is clocked.

15 Claims, 15 Drawing Sheets

SYNCHRONOUS MEMORY DEVICE FOR PREVENTING ERRONEOUS OPERATION DUE TO DQS RIPPLE

FIELD OF THE INVENTION

The present invention relates to semiconductor memory devices; and, more particularly, to a semiconductor memory device capable of preventing erroneous operation due to DOS ripple that is clocked and inputted at the timing when data is inputted.

BACKGROUND OF THE INVENTION

A semiconductor memory device has been continuously improved in its integrated degree and its operation speed. For rising the operating speed, so called, a synchronous memory device is introduced, which operates in synchronous with a clock from external of a memory chip.

The first suggested one is so called a SDR (Single Data Rate) synchronous memory device, which inputs or outputs one data over one clock cycle at a data pin in synchronous with a rising edge of the clock from the external of the memory device.

However, the SDR synchronous memory device is also short to satisfy system speed for high-speed operation. Therefore, a DDR (Double Data Rate) synchronous memory device is introduced, which processes two data for one clock cycle.

In the DDR synchronous memory device, two data are subsequently inputted or outputted at its data input or output pins in synchronous with the rising edge and the falling edge of the clock form the external of the memory device. As such, the DDR synchronous memory device gets to implement the high-speed operation because its bandwidth gets to at least two times than the conventional SDR synchronous memory device, without increasing the frequency of the clock.

However, because the DDR memory device should output or input two data for one clock cycle, in order to perform these data input and output effectively, the data access scheme that is used in the conventional synchronous memory device cannot be used for the DDR memory device.

Providing 10 nsec as the clock cycle and considering time for rising and falling (0.5×4=2 nsec) and time for other specification, two data should be processed substantially within about 6 nsec. Because the memory device is short to perform such a processing within itself, the memory device inputs or outputs data at the rising edge and the falling edge of the clock only for inputting or outputting data to/from the outside of the memory device, and substantially parallel processes two data synchronized to one edge of the clock within the memory device.

Accordingly, a new data access scheme is requested to transfer data from the memory device to an inner core region or output data from the inner core region to external.

For this purpose, a data input buffer of the DDR memory device pre-fetches 2-bit data that are synchronized to the rising edge and the falling edge and then transfers those data to the inner core region by synchronizing them to a rising edge of a main clock as even data or odd data.

However, as a semiconductor device such as a CPU (Central Processing Unit) increases its speed, the memory device is requested to operate at a higher speed. For this, there has been suggested a data input buffer that pre-fetches 4-bit data to transfer to the internal of the memory device.

On the other hand, to implement accurate timing for data input or output, when the memory device receives the data, a data strobe signal(hereinafter, a DQS signal) is inputted in addition to the data signal from the CPU or a memory controller which is located at the external of the memory device.

FIG. 1 is a block diagram for a 4-bit data pre-fetch data input buffer of a synchronous memory device according to the conventional technique.

Referring to FIG. 1, the buffer includes a data buffering unit 10 for buffering inputted data, a data align latching unit 20 for latching and aligning the input data to a first and a second rising data or a first and a second falling data, a multiplexer 30 for receiving the aligned 4 data align_dr0, align_df0, align_dr1, aling_df1 to selectively output them as odd data OD0, OD1 and even data EV0, EV1, a gio (global input/output) line driver 40 for transferring the odd data OD0, OD1 and the even data EV0, EV1 in response to an internal strove signal data_strobe to a globtal input/output line, and a data strobe buffering unit 50 for outputting a rising pulse dsrp and a falling pulse dsfp, each being generated at the rising edge and the falling edge of the DQS signal, by being enabled by an enable signal en_din that is generated by a write command.

FIG. 2 is a block diagram for the data align latching unit 20 shown in FIG. 1.

Referring to FIG. 2, the data align latching unit 20 includes a first rising latching unit 21 for latching data outputted from the data buffering unit 10 with the rising pulse dsrp to output as a first rising data rising_d0, a second rising latching unit 22 for latching the first rising data rising_d0 with the falling pulse dsfp to output a third align data align_dr1, a third rising latching unit 140 for latching the third align data align_dr1 with the rising pulse dsrp to output a second rising data rising_d1, a fourth rising latching unit 26 for latching the second rising data rising_d1 with the falling pulse dsfp to output a first align data align_r0, a first falling latching unit 23 for latching the data outputted from the data buffering unit 10 with the falling pulse dsfp to output a fourth align data align_df1, a second falling latching unit 25 for latching the fourth align data align_df1 with the rising pulse dsrp to output a falling data falling_d1, and a third falling latching 27 for latching the falling data falling_d1 with the falling pulse dsfp to output a second align data align_df0.

FIG. 3 is a block diagram for the data strobe buffering unit 50 shown in FIG. 1.

Referring to FIG. 1, the data strobe buffering unit 50 includes NMOS transistors MN1, MN2 for receiving a reference signal Vref and a DQS signal through their gates, respectively, an NMOS transistor MN3 for receiving an enable signal en_din, that is generated by a write command, at its gate, one end of the NMOS transistor MN3 being commonly coupled to one end of each of the NMOS transistors MN1, MN2 and the other end being connected to the ground voltage VSS, a PMOS transistor MP1 for connecting a power voltage VDD to the other end of the NMOS transistor MN1, the gate of the PMOS transistor MP1 being diode-coupled to the other end of the NMOS transistor MN1, a PMOS transistor MP2 for connecting the power voltage VDD to the other end of the NMOS transistor MN2 for forming a current mirror with the PMOS transistor MP1, a PMOS transistor MP3 for receiving the enable signal en_din at its gate and connecting the power voltage VDD to the other end of the NMOS transistor MN1, a PMOS transistor MP4 receiving the inverted version of the enable signal en_din at its gate and connecting the power voltage VDD to the other end of the NMOS transistor MN2, serially coupled inverters I1, I2, I3 for buffering and outputting the common node of the PMOS transistor MP2 and the NMOS transistor MN2, inverters I7, I8 serially coupled to the inverter I3 for outputting the rising pulse, and inverters I4, I5, I6 serially coupled to the inverter I3 for outputting the falling pulse.

FIG. 4 is a waveform diagram for illustrating the operation when BL=8 in the synchronous memory device shown in FIG. 1. It will be described for the operation of the memory device with reference to FIGS. 1 to 4.

First, data D0–D7 are inputted in synchronous with the rising edge and the falling edge of the operation clock CLK and a DQS signal is inputted at the timing when the data D0–D7 are inputted.

The data strobe buffering unit 50 is enabled by the enable signal en_din that is generated by the write command to generate the rising pulse dsrp that is outputted as a pulse at the rising edge of the DQS signal and the falling pulse dsfp that is outputted as a pulse at the falling edge of the DQS signal.

While sustaining high impedance state when there is no operation, the DQS signal is clocked according to the timing when the data are inputted in a preamble state (X period in FIG. 4) in which the DQS signal goes to and keeps low level one clock earlier than the data is inputted. Upon receiving all the data, the DQS signal stays in a post-amble state (Y period in FIG. 4) of the low level for a while and then returns to and keeps the high impedance state.

In turn, the first rising latching unit 21 latches the first, the third, the fifth and the seventh data D0, D2, D4, D6 at the rising pulse dsrp to output as the first rising data rising_d0.

In turn, the second rising latching unit 22 latches the first rising data rising_d0 at the falling pulse dsfp to output the third align data align_r1, and the first falling latching unit 23 latches the second, the fourth, the sixth and the eighth data D1, D3, D5, D7 at the falling pulse dsfp to output as the fourth align data align_f1.

In turn, the third rising latching unit 24 latches the third align data align_r1 at the rising pulse dsrp to output as the second rising data rising_d1 and the second falling latching unit 25 latches the fourth align data align_f1 at the rising pulse dsrp to output the falling data falling_d1.

In turn, the fourth rising latching unit 26 latches the second rising data rising_d1 at the falling pulse dsfp to output the first align data align_r0, and the third falling latching unit 27 latches the falling data align_df0 at the falling pulse fsfp4 to output the second align data align_f0.

In turn, the multiplexer 30 receives the first to the fourth align data align_dr0, align_df0, align_dr1, align_df1 to output the even data EV0, EV1 and the odd data OD0, OD1. Here, the select signal that is inputted to the multiplexer 30 is to select the multiplexer at a mode when the memory device gets 4 data or 8 data simultaneously.

In turn, the gio line driver 40 transfers the even data EV0, EV1 or the odd data OD0, OD1 to the global input/output line in response to the inner strobe signal data_strobe. After that, data that is transferred to the global input/output line is transferred to a cell array.

FIG. 5 is a waveform diagram for explaining the shortage of the memory device shown in FIG. 1. It will be described for the shortage of the conventional memory device with reference to FIGS. 1 to 5.

As described above, while sustaining high impedance state when there is no operation, the DQS signal is clocked while the data is inputted in synchronous with the rising pulse and the falling pulse of the operation clock CLK, and returns to the high impedance state after input of all the data.

However, during return to the high impedance state after input of all the data, ripple happens, which is to cause error because of overshoot of the ripple.

That is, due to the overshoot during return of the data strobe signal to the high impedance, the inverters I4-I8 happen to operate to generate a dummy rising pulse and a dummy falling pulse (see, X in FIG. 5) even after input of all the data so as to probably damage the latched data.

SUMMARY OF THE INVENTION

It is, therefore, an object of the present invention to provide a memory device capable of preventing erroneous operation due to DQS ripple.

In accordance with the present invention, there is provided a synchronous memory device receiving a number of data in synchronous with a rising edge and a falling edge of an operation clock, including a data strobe buffering unit for outputting a rising pulse and a falling pulse for detecting a rising edge and a falling edge of a DQS signal that sustains high impedance state when there is no operation and is clocked while the data is inputted, a data align latching unit for latching and aligning the data in synchronous with the rising pulse and the falling pulse, and a DQS signal controlling unit for controlling the data strobe buffering unit to output the rising pulse and the falling pulse to the data align latching unit only while the DQS signal is clocked.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, a preferred embodiment of the present invention will be explained in detail.

Figure 6:
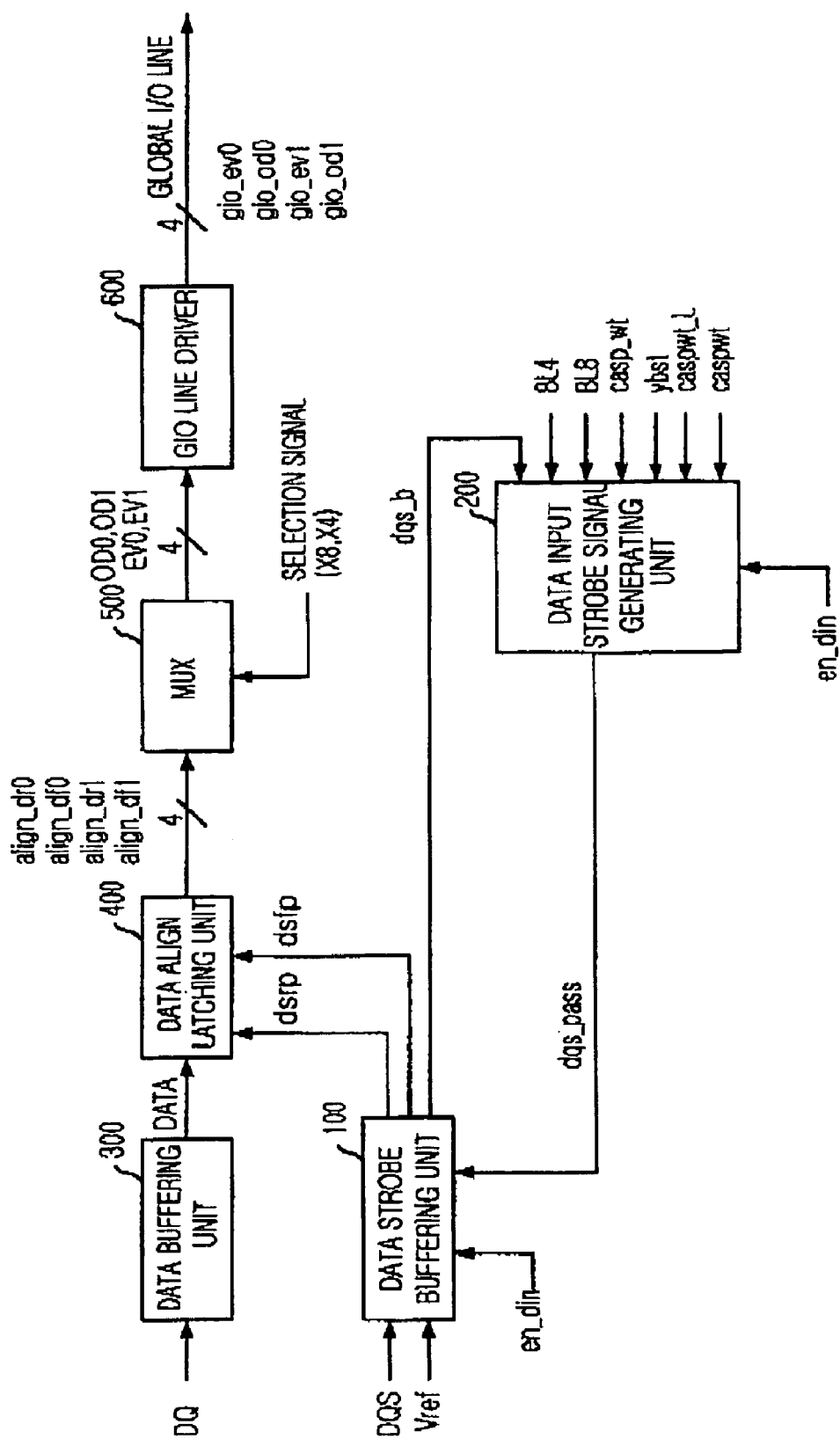
FIG. 6 provides a block diagram of a synchronous memory device in accordance with a preferred embodiment of the present invention.

FIG. 6 is a block diagram of a synchronous memory device in accordance with a preferred embodiment of the present invention.

Referring to FIG. 6, there is provided a synchronous memory device receiving a number of data in synchronous with a rising edge and a falling edge of an operation clock in accordance with an embodiment of the present invention, comprising a data strobe buffering unit 100 for outputting a rising pulse dsrp and a falling pulse dsfp for detecting a rising edge and a falling edge of a DQS signal that is clocked when data is inputted while sustaining high impedance state when there is no operation, a data align latching unit 400 for latching and aligning the data in synchronous with the rising pulse dsrp and the falling pulse dsfp, and a DQS signal controlling unit 200 for controlling the data strobe buffering unit to output the rising pulse dsrp and the falling pulse dsfp to the data align latching unit 400 only while the DQS signal is clocked.

Here, the DQS buffering unit 100 and the DQS signal controlling unit 200 are enabled by a DQS enable signal en_din that is generated by a write command.

Figure 1:
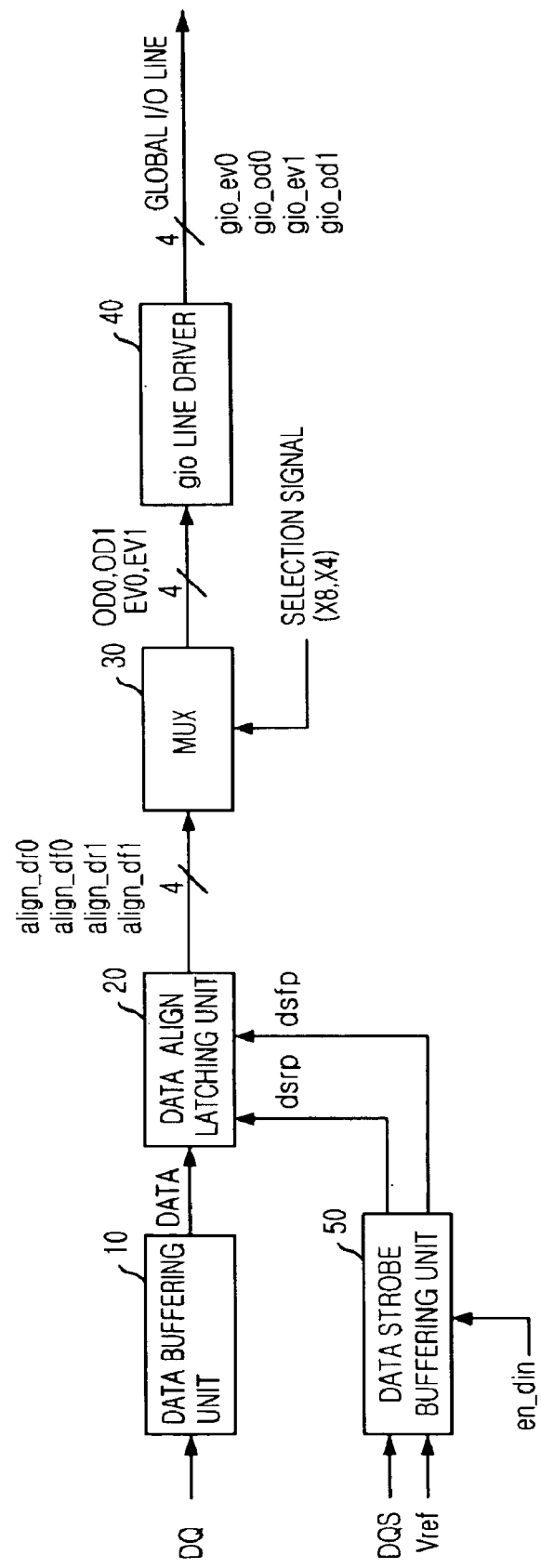
FIG. 1 provides a block diagram of a data input part of a conventional synchronous memory device.
Figure 2:
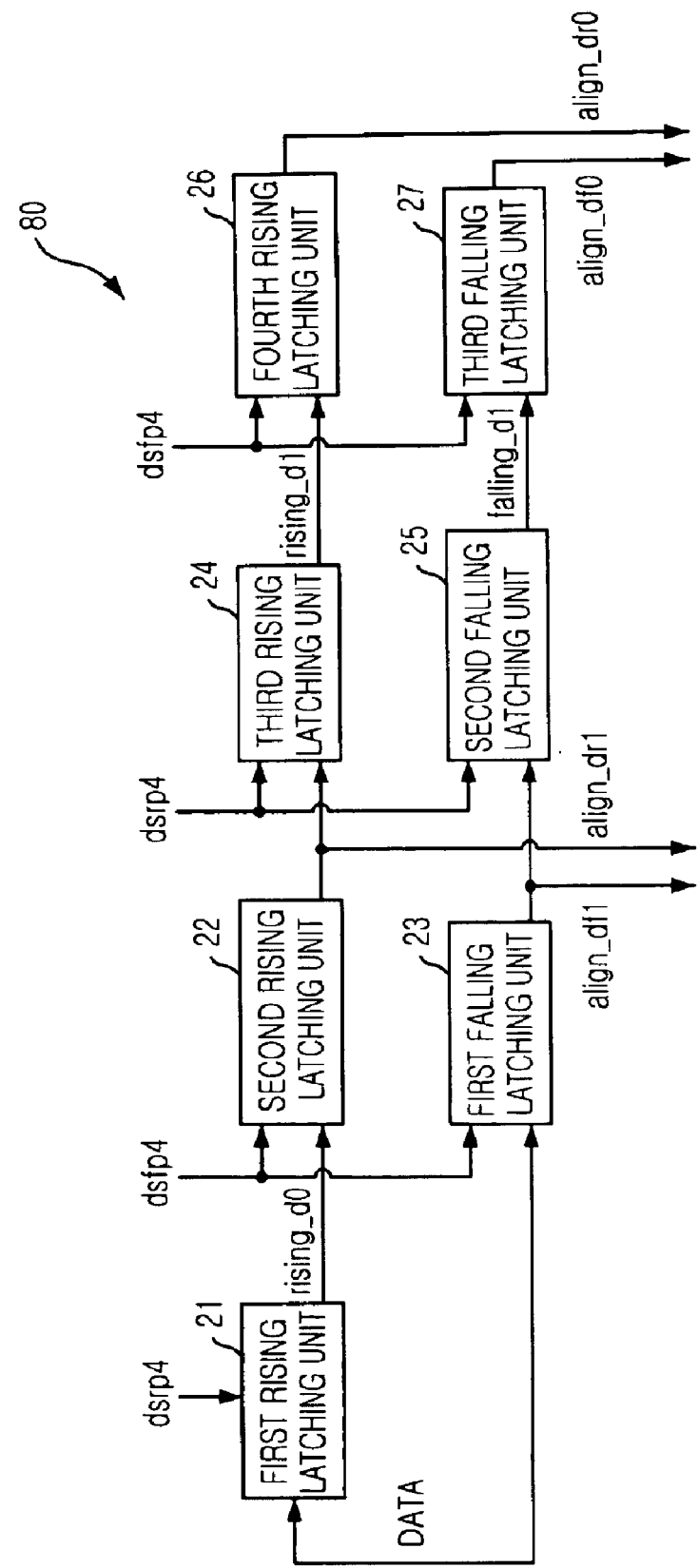
FIG. 2 is a block diagram of a data align latching unit shown in FIG. 1.
Figure 3:
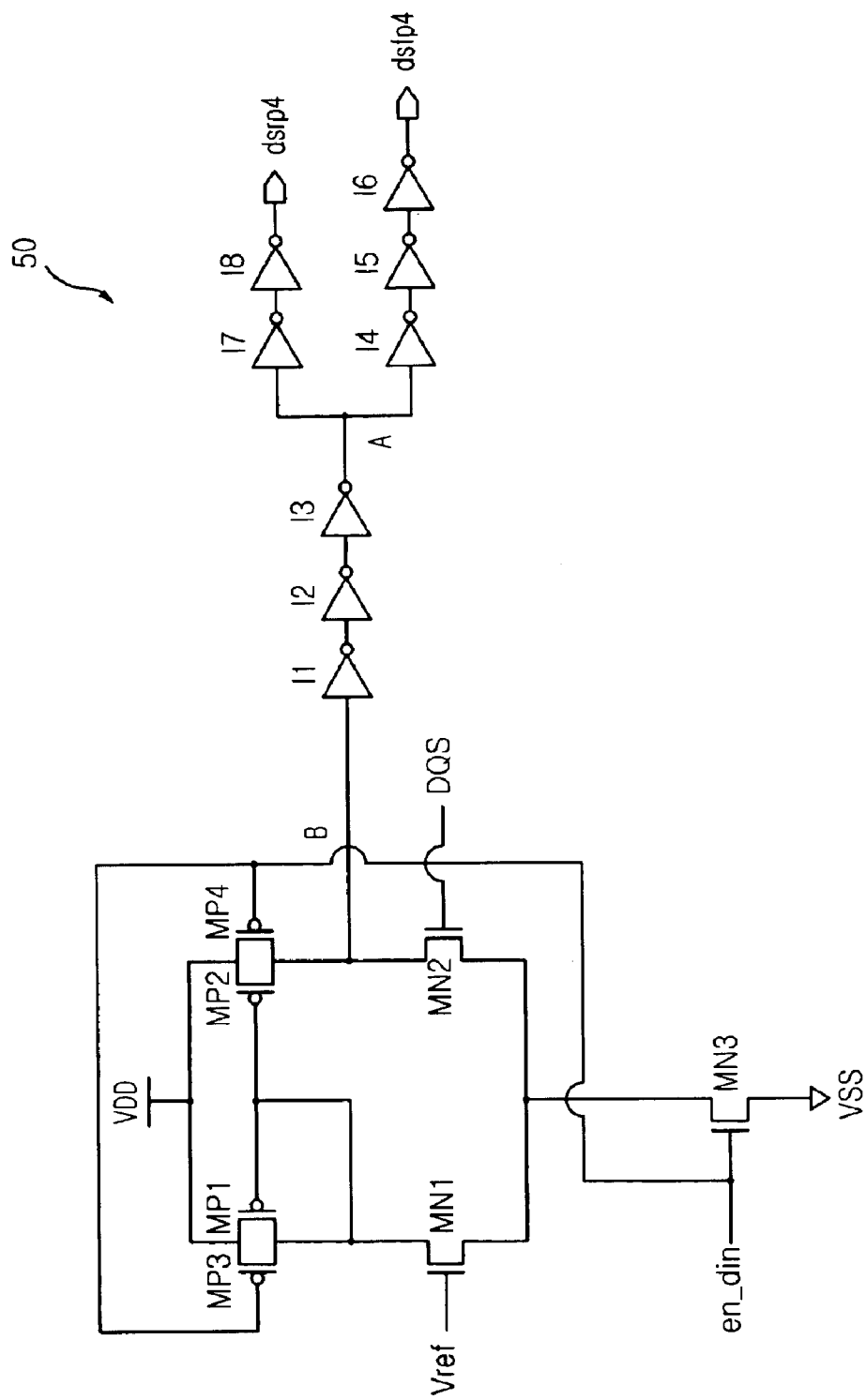
FIG. 3 describes a circuit diagram for a data strobe buffering unit shown in FIG. 1.

The synchronous memory device further includes a data buffering unit 300, a multiplexer 500 and a gio (global input/output) line driver 600, which elements are equivalent to data buffering unit 10, multiplexer 30 and line driver 40, respectively described above with reference to FIG. 1.

Figure 7:
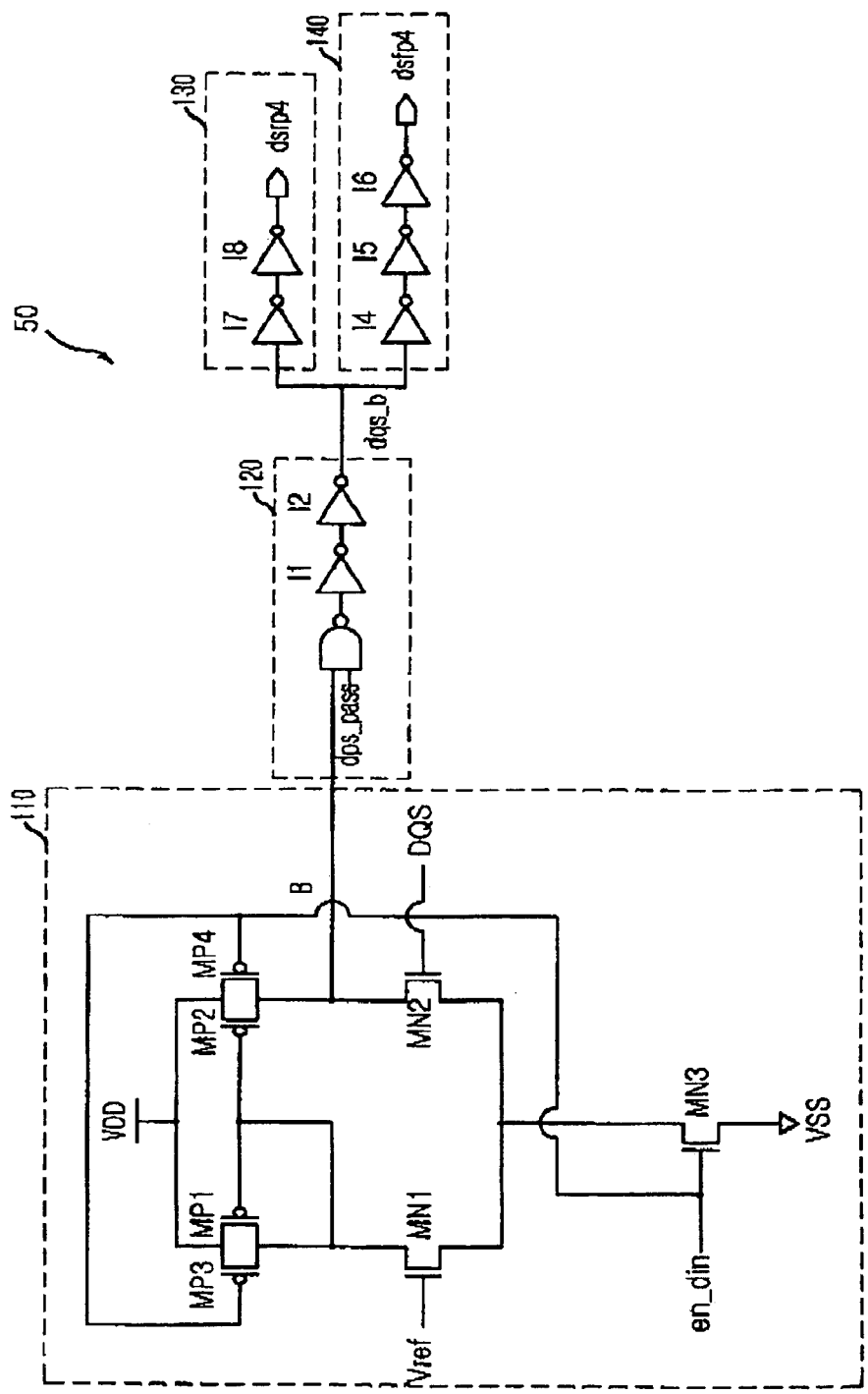
FIG. 7 shows a circuit diagram of a data strobe buffering unit shown in FIG. 6.

FIG. 7 shows a circuit diagram of a data strobe buffering unit shown in FIG. 6.

Referring to FIG. 7, there is provided the data strobe buffering unit 100 including a differential amplifier 110 for receiving the DQS signal and a reference voltage Vref, a first buffering unit 120 enabled by a DQS pass signal dqs_pass that is outputted from the DQS signal controlling unit 200 for buffering and outputting the output signal B of the differential amplifier 110, a second buffering unit 130 for buffering the output of the first buffering unit 120 to output the rising pulse dsrp, and a third buffering unit 140 for buffering the output of the first buffering unit 120 to output the falling pulse dsfp.

The differential amplifier 110 includes MOS transistors MN1, MN2 for receiving the reference voltage Vref and the DQS signal at their gates, respectively, a diode-type MOS transistor MP1 coupled to the power voltage VDD and one end of the MOS transistor MN1, the gate of the MOS transistor MP1 being coupled to one end of the MOS transistor MN1, a MOS transistor MP2 coupled to the power voltage VDD and one end of the MOS transistor MN2, the gate of the MOS transistor MP2 being coupled to the gate of the MOS transistor MP1 to form a current mirror, and a MOS transistor MN3 for connecting the commonly coupled other end of each of the MOS transistors MN1, MN2 to the ground voltage VSS, and receiving, at its gate, the DQS enable signal en_din that is generated by a write command.

The differential amplifier 110 further includes a MOS transistor MP3 for receiving the DQS enable signal en_din at its gate and coupled parallel to the MOS transistor MP1, and a MOS transistor MP4 for receiving the DQS enable signal en_din at its gate and coupled parallel to the MOS transistor MP2.

Further, the first buffering unit 120 includes a NAND gate ND1 for receiving the second MOS transistor MP4 and the DQS pass signal dqs_pass that is outputted from one end of the DQS signal controlling unit 200, and a first and a second inverters I1, I2, serially coupled to each other, for buffering and outputting the output of the NAND gate ND1.

The second buffering unit 130 includes a third inverter I3 for outputting the inverted output of the second inverter I2, and a fourth inverter I4 for outputting the inverted output of the third inverter I3 as the rising pulse dsrp.

Also, the third buffering unit 140 includes a fifth inverter I5 for outputting the inverted output of the second inverter I2, a sixth inverter I6 for outputting the inverted output of the fifth inverter I5, and a seventh inverter I7 for outputting the inverted output of the sixth inverter I6 as the falling pulse dsfp.

Figure 8:
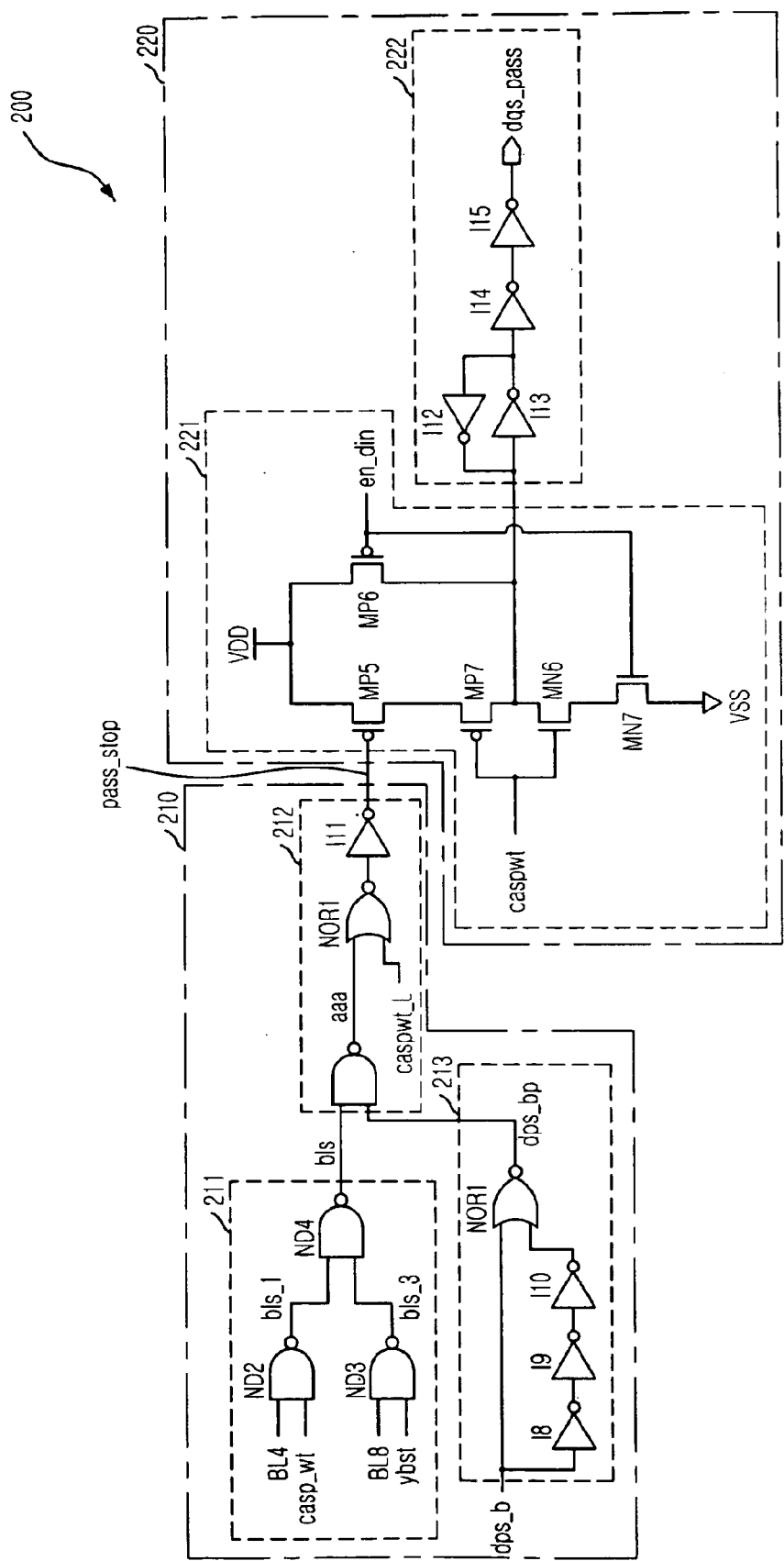
FIG. 8 is a circuit diagram of a DQS signal controlling unit shown in FIG. 6.

FIG. 8 is a circuit diagram of a DQS signal controlling unit shown in FIG. 6.

Referring to FIG. 8, the DQS signal controlling unit 200 includes a DQS signal disabling unit 210 for outputting a DQS stop signal pass_stop in the post-amble state of the DQS signal for stopping outputting of the DQS signal, and a DQS pass signal generating unit 220 for enabling the DQS pass signal dqs_pass with a preamble pulse signal caspwt that is generated during the preamble period of the DQS signal, and disabling the DQS pass signal dqs_pass in response to the DQS stop signal pass_stop.

The DQS pass signal generating unit 220 includes a DQS state detecting unit 221 enabled by the DQS enable signal en_din that is generated by the write command for changing the output C to a first level(a low level) in response to the preamble signal caspwt that is generated in the preamble state of the DQS signal and changing the output C to a second level(a high level) in response to the DQS stop signal pass_stop, and a DQS pass signal outputting unit 222 for latching and outputting the signal level of the output C of the DQS state detecting unit 221.

The DQS state detecting unit 221 includes a MOS transistor MP5 receiving the DQS stop signal pass_stop at its gate, one end of the MOS transistor MP5 being coupled to the power voltage VDD, a MOS transistor MP7 receiving the preamble pulse signal caspwt at its gate, one end of the MOS transistor MP7 being coupled to the other end of the MOS transistor MP5, a MOS transistor MN6 receiving the preamble pulse signal caspwt at its gate, one end of the MOS transistor MN6 being coupled to the other end of the MOS transistor MP7, a MOS transistor MN7 receiving the DQS enable signal en_din at its gate, one end of the MOS transistor MN7 being coupled to the other end of the MOS transistor MN6 and the other end to the ground voltage VSS, and a MOS transistor MP6 receiving the DQS enable signal en_din at its gate and connecting the power voltage VDD to the common node of the MOS transistor MP7 and the MOS transistor MN6.

The DQS pass signal outputting unit 222 includes an inverter I13, its input being coupled to the power voltage VDD and the common node of the MOS transistor MP7 and the MOS transistor MN6, an inverter I12, its input and its output being coupled to the input and the output of the inverter I13, respectively, an inverter I14 for outputting the inverted output of the inverter I12, and an inverter I15 for outputting the inverted output of the inverter I14 as the DQS pass signal dqs_pass.

Also, the DQS disabling unit 210 includes a burst length detecting unit 211 for outputting a burst length signal bls that is enabled at the timing when the last data among a number of the inputted data is inputted in a burst length mode, a DQS pulse generating unit 213 for outputting a DQS pulse signal dqs_bp that is generated as a pulse at every timing when the DQS signal is clocked, and a DQS stop signal generating unit 212 for outputting the DQS stop signal pass_stop by using the DQS pulse signal dqs_bp that is inputted while the burst length signal bls is enabled.

Also, the DQS stop signal generating unit 212 includes a NAND gate ND5 receiving the burst length signal bls and the DQS pulse signal dqs_bp, a NOR gate NOR2 receiving the output of the NAND gate ND5 and a DQS sustain signal caspwt_L that has the high level during an interrupt mode and a gapless mode, and an inverter I11 for inverting the output of the NOR gate NOR 2 to output the DQS stop signal pass_stop.

Also, the burst length detecting unit 211 includes a NAND gate ND2 receiving a first burst length signal BL4 that sustains the enable state when the burst length mode is '4' (BL='4') and a first burst mode enable signal casp_wt that is enabled at the timing when the fourth data is inputted during the period when the burst length mode is '4', a NAND gate ND3 receiving a second burst length signal BL8 that sustains the enable state when the burst length mode is '8' (BL='8') and a second burst mode enable signal ybst that is enabled at the timing when the eighth data is inputted during the period when the burst length mode is '8', and a NAND gate ND4 receiving the outputs of the NAND gate ND2 and the NAND gate ND3 to output the burst length signal bls.

Figure 9:
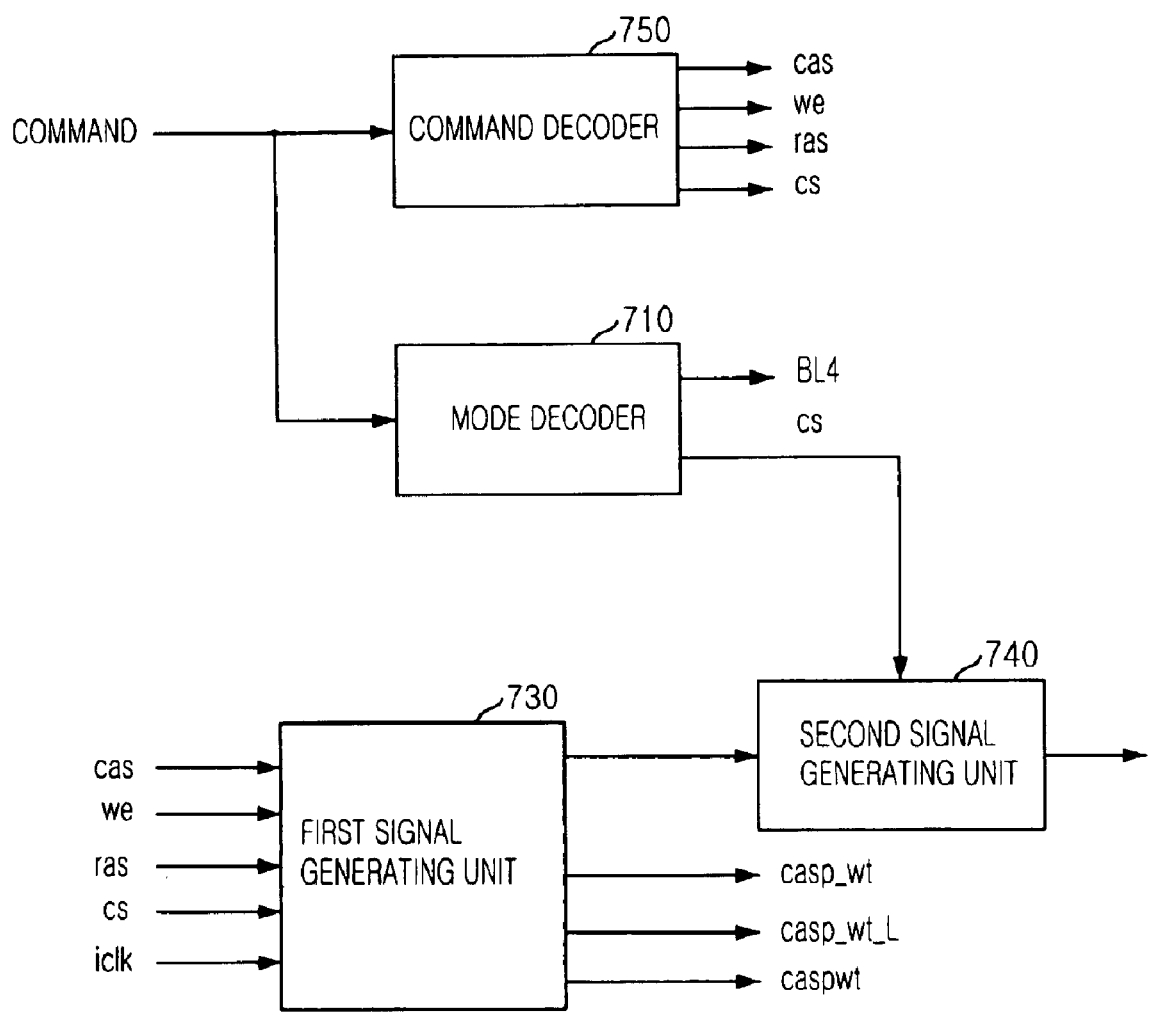
FIG. 9 offers a block diagram for generating an input signal to the DQS signal controlling unit shown in FIG. 6.

FIG. 9 offers a block diagram for generating an input signal to the DQS signal controlling unit shown in FIG. 6.

As described above, in order to generate the DQS pass signal dqs_pass at the DQS signal controlling unit 200 of the present invention, the DQS signal controlling unit 200 receives the first and the second burst length signals BL4. BL8, the first and the second burst mode enable signal casp_wt, ybst, the DQS sustain signal caspwt_L and the preamble pulse signal caspwt.

Referring to FIG. 9, a first signal generating unit 730 receives a cas signal cas, a write enable signal we, a ras signal ras, a select signal cs and an internal clock iclk and outputs the first burst mode enable signal casp_wt, the DQS sustain signal caspwt_L and the preamble pulse signal caspwt. Also, the first signal generating unit 730 generates a first write start signal casp6_wt to output to a second signal generating unit 740, which notices start of inputting of address where the data is to be written when BL=4.

The second signal generating unit 740 receives a first write start signal casp6_wt, a second burst length signal BL8 and an internal clock iclk to generate the second burst mode enable signal ybst.

Also, a command decoder 750 receives a command from the external of the memory device and outputs the cas signal cas, the ras signal ras, the write enable signal we and the select signal cs. A mode decoder 710 generates the first and the second burst length signals BL4, BL8.

Figure 10:
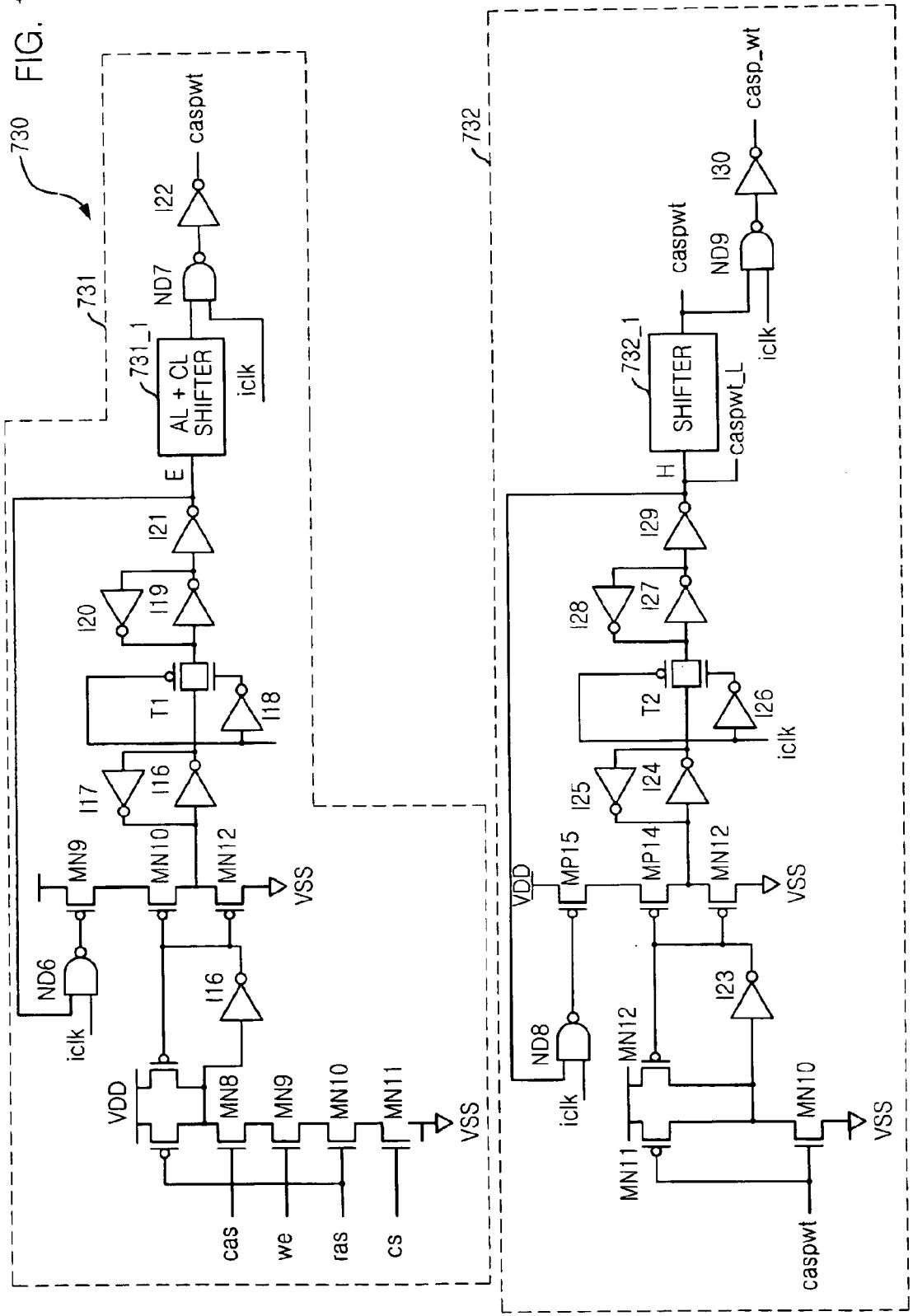
FIG. 10 shows a circuit diagram for a first signal generating unit shown in FIG. 9.

FIG. 10 shows a circuit diagram for the first signal generating unit shown in FIG. 9.

Referring to FIG. 10, the first signal generating unit 730 includes a preamble pulse signal generating unit 731, a DQS sustain signal caspwt_L and second burst mode signal casp_wt generating unit 732.

The preamble pulse signal generating unit 731 includes MOS transistors MN8, MN9, MN10, MN11, serially coupled to the node C and the ground VSS, receiving the cas signal cas, the write enable signal we, the ras signal ras and the select signal cs, respectively, a MOS transistor MP7 connecting the power voltage VDD and the node C and receiving the ras signal ras at its gate, an inverter I16, its input being coupled to the node C, a MOS transistor MP8 connecting the power voltage VDD and the node C and receiving the output of the inverter I16 at its gate, MOS transistors MN10, MN12, serially coupled to a node D and the ground voltage VSS, receiving the output of the inverter I16 at their gates, a NAND gate ND6 receiving the internal clock iclk and the signal on a node E, a MOS transistor MP9 receiving the output of the NAND gate ND6 at its gate and connecting the power voltage VDD and the node D, inverters I16, I17 for latching the signal that is inputted to the common drain of the MOS transistors MN10, MN12, a transmission gate T1 turned on at every timing when the internal clock iclk is clocked to transfer the output of the inverter I16, inverters I19, I20 for latching the signal from the transmission gate T1, an inverter I21 for outputting the inverted output of the inverter I19, an AL+CL shifter 731_1 for shifting the signal on the node E by AL(Additive Latency) and CL(Cas Latency), a NAND gate ND7 receiving output of the AL+CL shifter 731_1 and the internal clock iclk, and an inverter I22 for outputting the inverted output of the NAND gate ND7 as the preamble pulse signal caspwt.

The DQS sustain signal caspwt_L and second burst mode signal casp_wt generating unit 732 includes a MOS transistor MN13 receiving the preamble pulse signal caspwt at its gate and connecting a node F and the ground voltage VSS, a MOS transistor MP11 connecting the power voltage VDD and the node F and receiving the preamble pulse signal caspwt at its gate, an inverter I23, its input being coupled to the node F, a MOS transistor MP12 connecting the power voltage VDD and the node F and receiving the output of the inverter I23 at its gate, MOS transistors MN14, MN14, serially coupled to a node G and the ground VSS, receiving the output of the inverter I23 at its gate, a NAND gate ND8 receiving the internal clock iclk and the signal on a node H, a MOS transistor MP13 receiving the output of the NAND gate ND8 at its gate and connecting the power voltage VDD and a node G, inverters I24, I25 for latching the signal that is inputted to the common drain of the MOS transistors MN14, MN14, a transmission gate T2 turned on at every timing when the internal clock iclk is clocked to transfer the output of the inverter I24, inverters I27, I28 for latching the signal from the transmission gate T2, an inverter I29 for outputting the inverted output of the inverter I27, a shifter 732_1 for shifting the signal on the node H by two cycle of the internal clock iclk to output the first burst mode signal casp_wt, a NAND gate ND9 receiving the output casp_wt of the shifter 732_1 and the internal clock iclk, and an inverter I30 for inverting the output of the NAND gate ND9 to output the first write start signal casp6_wt.

Figure 11:
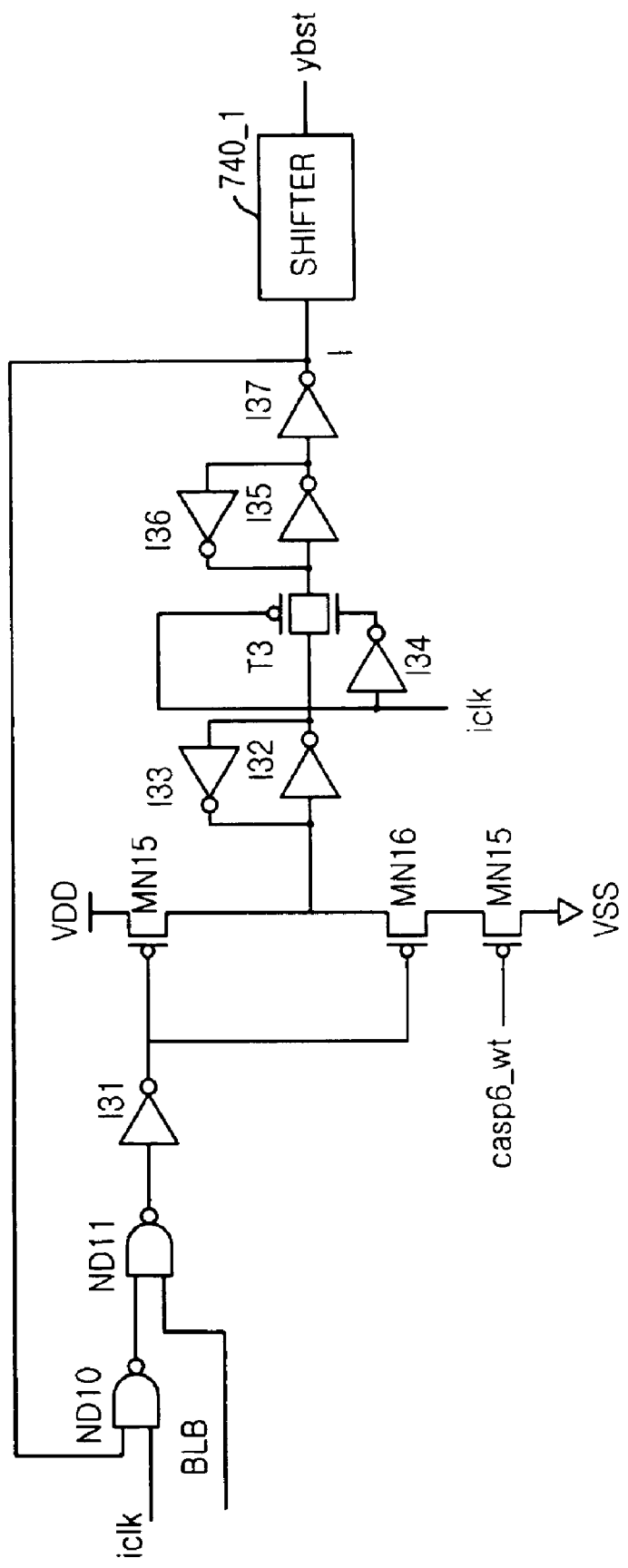
FIG. 11 shows a circuit diagram for a second signal generating unit shown in FIG. 9.

FIG. 11 shows a circuit diagram for a second signal generating unit shown in FIG. 9.

Referring to FIG. 11, the second signal generating unit 740 includes a NAND gate ND10 receiving the signal that is inputted to the node D and the internal clock iclk, a NAND gate ND11 receiving the output of the NAND gate ND10 and the second burst length signal BL8, an inverter I31 for outputting the inverted output of the NAND gate ND11, a MOS transistor MN15 receiving the first write start signal casp6_wt at its gate, one end of the MOS transistor MN15 being coupled to the ground voltage VSS, MOS transistors MP15, MP16, serially coupled to the power voltage VDD and the other end of the MOS transistor MN15, receiving the output of the inverter I31 at their gates, inverters I32, I33 for latching the signal that is inputted to the common drain of the MOS transistors MP15, MN16, a transmission gate T3 turned on at every timing when the internal clock iclk is clocked to transfer the output of the inverter I32, inverters I36, I37 for latching the signal from the transmission gate T3, an inverter I38 for outputting the inverted output of the inverter I35, and a shifter 740_1 for shifting the signal on a node I by one cycle of the internal clock iclk to output the second burst mode enable signal ybst.

Figure 12A:
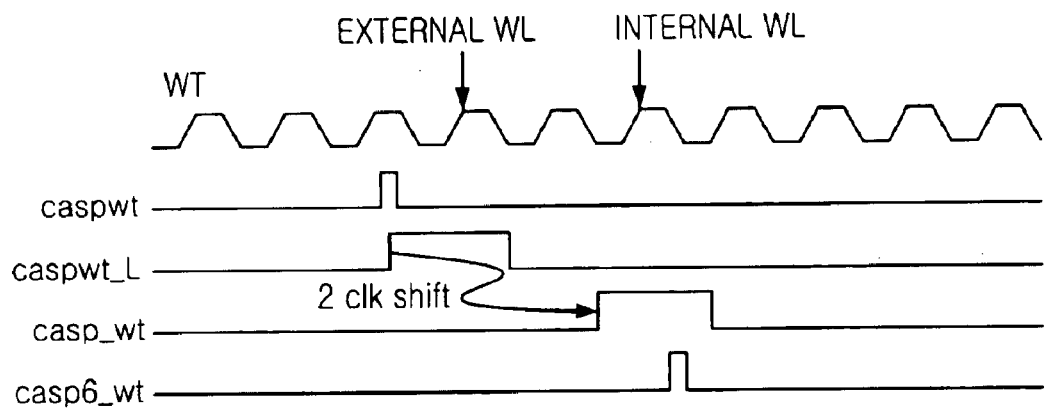
FIG. 12A is a waveform diagram for an input signal to a DQS signal controlling unit shown in FIG. 6 when BL=4.
Figure 12B:
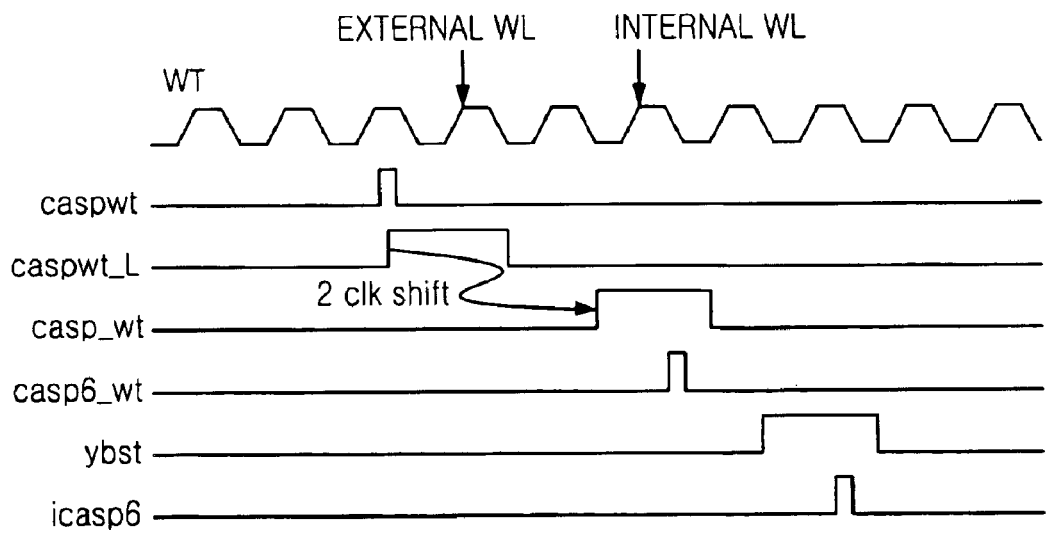
FIG. 12B is a waveform diagram for an input signal to a DQS signal controlling unit shown in FIG. 6 when BL=8.

FIG. 12A is a waveform diagram for an input signal to a DQS signal controlling unit shown in FIG. 6 when BL=4 and FIG. 12B is a waveform diagram for an input signal to a DQS signal controlling unit shown in FIG. 6 when BL=8.

First, the waveforms shown in FIG. 12A and 12B represent the signals that are inputted to the DQS signal controlling unit 200 which is included in the memory device in accordance with the present invention, which are not additional internal signal within the memory device for the present invention but basically used signals to implement the DDR II synchronous memory device.

The present invention uses a combination of the signals caspwt, caspwt_L, casp_wt, ybst that are basically used to implement the DDR II synchronous memory device to generate the DQS pass signal that is enabled during the timing when the DQS signal is outputted from the DQS signal controlling unit 200.

Accordingly, because the only block additionally included in the DDR II memory device in accordance with the present invention is the DQS signal controlling unit 200, the chip area of the synchronous memory device according to the present invention does not substantially increase.

First, referring to FIG. 10, 11 and 12A, it will be described for the input signals to the DQS signal controlling unit 200 when BL=4.

Figure 4:
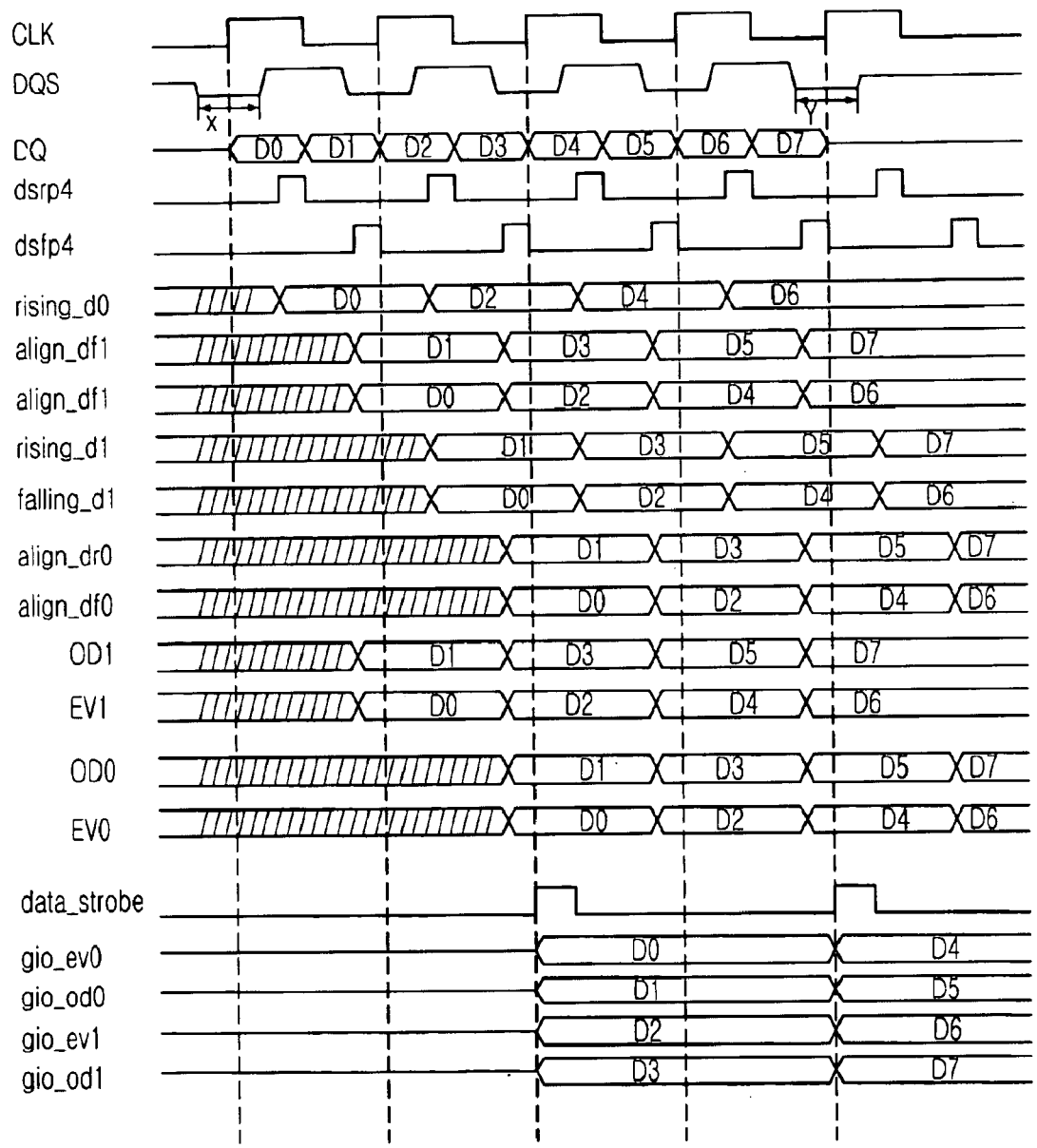
FIG. 4 illustrates operation of a synchronous memory device shown in FIG. 1.

The preamble pulse signal generating unit 731 of the first signal generating unit 730 outputs the preamble pulse signal caspwt at the timing when the internal clock iclk is clocked when the cas signal cas, the write enable signal we, a ras signal ras and the select signal cs from the command decoder 750 are all on the high level. Here, the preamble pulse signal caspwt is generated when the DQS signal is in the preamble period(see, X in FIG. 4).

In turn, the DQS sustain signal caspwt_L and second burst mode signal casp_wt generating unit 732 generates the DQS sustain signal caspwt_L having the pulse width of one clock cycle by using the preamble pulse signal caspwt, and the second burst mode signal casp_wt by shifting the DQS sustain signal by two clock cycles.

Also, the DQS sustain signal caspwt_l and second burst mode signal casp_wt generating unit 732 generates the first write start signal casp6_wt, which notices the start of inputting of column addresses that are used to continuously store 4 data when BL=4.

In turn, referring to FIG. 10, 11 and 12B, it will be described for the input signals to the DQS signal controlling unit when BL=8.

The second signal generating unit 740 receives the first write start signal casp6_wt, the first burst length signal BL8 and the first write start signal casp6_wt to generate the second burst mode enable signal ybst. Here, a second write start signal icasp6 notices the start of inputting of column addresses that are used to continuously store 8 data when BL=8.

Figure 13:
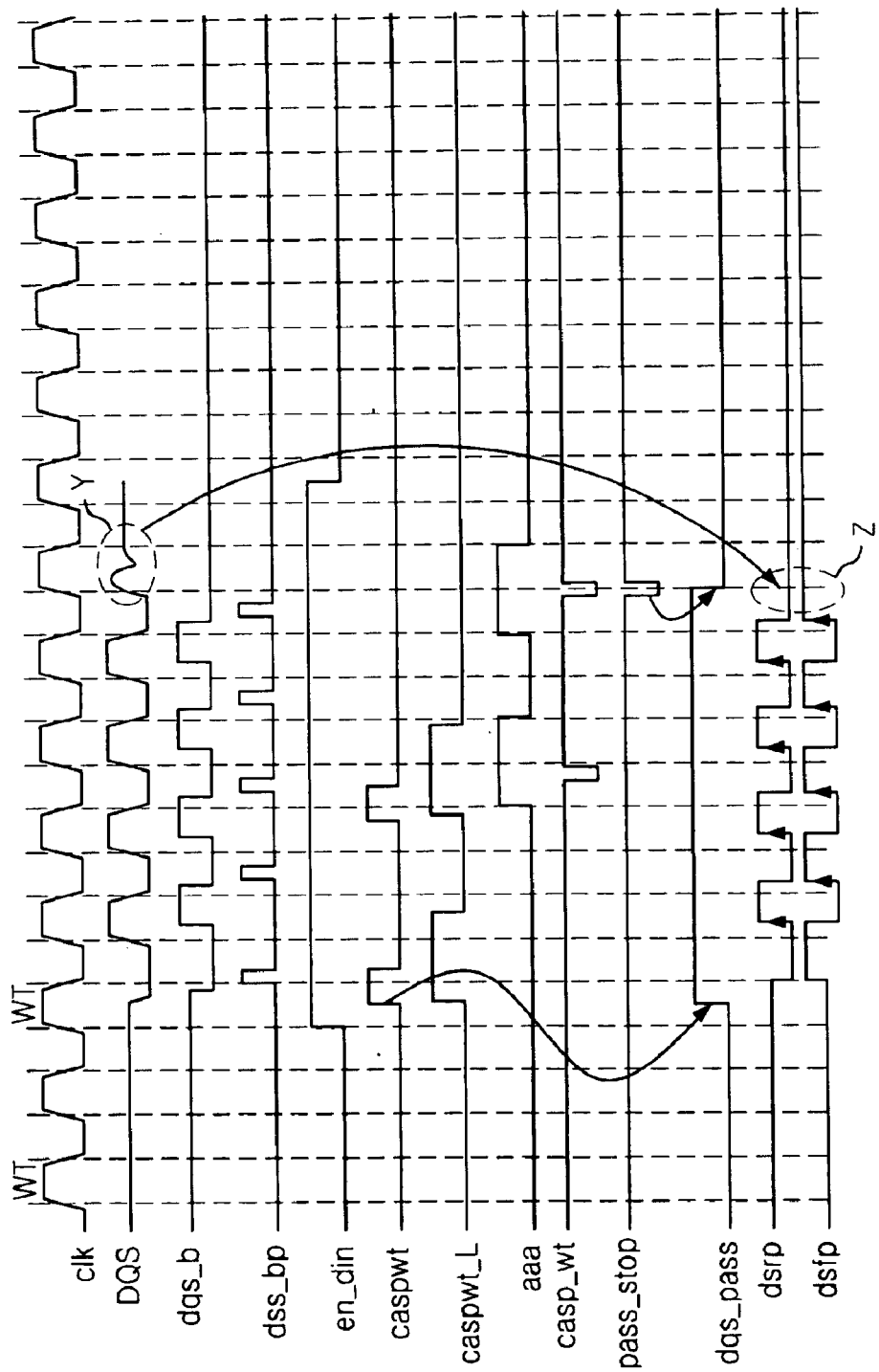
FIG. 13 provides a waveform diagram for explaining operation of a memory device shown in FIG. 6 when BL=4.

FIG. 13 provides a waveform diagram for explaining operation of a synchronous memory device shown in FIG. 6 when BL=4.

With reference to FIGS. 6 to 13, it will be described for operation of the memory device in accordance with an embodiment of the present invention when BL=4.

First, preamble pulse signal caspwt is generated during the period when the enable signal en_din is enabled in the data strobe buffering unit 100 to be inputted to the DQS pass signal generating unit 220 to enable the DQS pass signal dqs_pass to the high state. The DQS pass signal dqs_pass is inputted to the NAND gate ND1 of the first buffering unit 120 in the data strobe buffering unit 100. Accordingly, the NAND gate ND1 operates as an inverter to invert the signal on the node B to transfer to the inverter I1.

In turn, 4 data are inputted in synchronous with the rising edge and the falling edge of the operation clock CLK, and the DQS signal that is inputted as clocked at the timing of data input become the rising pulse dsrp and the falling pulse dsfp after passing through the first to the third buffering unit 120, 130, 140 to be outputted to the data align latching unit 400.

On the other hand, a buffered data strobe signal dqs_b is outputted at the node A of the data strobe buffering unit 100. Then, the DQS pulse generating unit 213 of the DQS signal controlling unit 200 receives the buffered data strobe signal dqs_b to output the DQS pulse signal dqs_bp to the NAND gate ND5 of the DQS signal disabling unit 210.

When the first burst mode enable signal casp_wt is enabled to the high level while the first burst length signal BL4, that sustains the enable state when the burst length is 4, is enabled, the output of the NAND gate ND2 becomes to the low level and the output of the NAND gate ND4 becomes to the high level.

In this state, the DQS pulse signal dqs_bp is inputted to the NAND gate ND5 to make the output of the NAND gate ND5, that is, the node aaa, the low level for a very short time. At that time, if the DQS sustain signal caspwt_L is in the high level, the output of the NOR gate NOR2 always becomes the low level so that the DQS stop signal dqs_stop is not generated; otherwise, if the DQS sustain signal caspwt_L is in the low level, the output of the NOR gate NOR2 becomes the high level so that the DQS stop signal dqs_stop is generated to turn on the NOS transistor MP5 of the DQS state detecting unit 221.

Upon the MOS transistor MP5 turned on, the node C becomes the high level and, in turn, the DQS pass signal dqs_pass that is outputted from the inverter I15 in the DQS pass signal outputting unit 222 is disabled in the low level.

When the DQS pass signal dqs_pass becomes the low level to be disabled, the output of the NAND gate ND1 of the data strobe buffering unit 100 always sustains the high level regardless of the state of the node B. After that, the DQS signal cannot pass through the first buffering unit 120 so that the rising pulse dsrp is not generated(see, Z in FIG. 13).

Accordingly, even when the data input is finished, there is no erroneous operation due to the ripple of the DQS signal (see, Y in FIG. 13).

Figure 14:
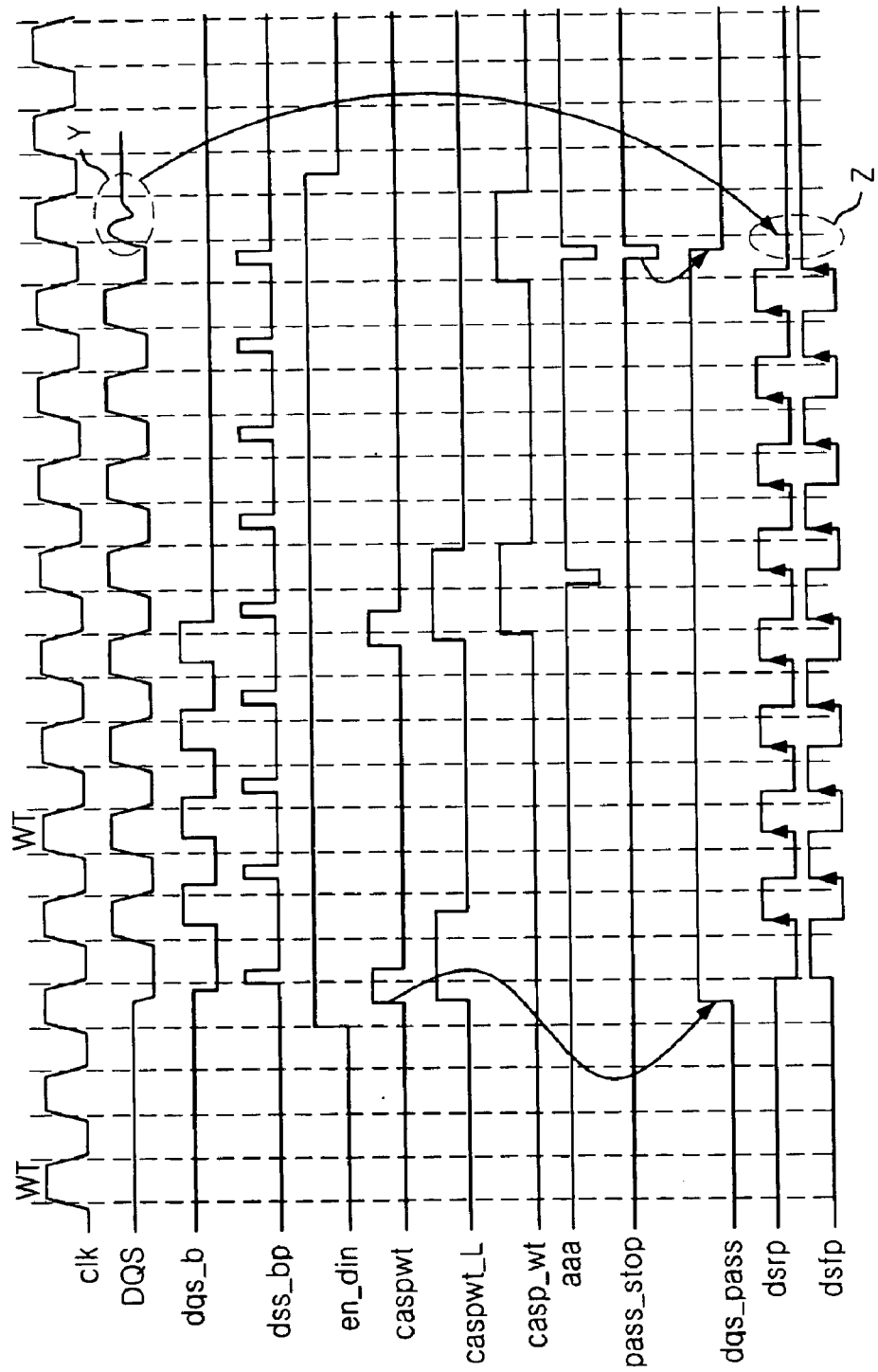
FIG. 14 provides a waveform diagram for explaining operation of a memory device shown in FIG. 6 when BL=8.

FIG. 14 provides a waveform diagram for explaining operation of a memory device shown in FIG. 6 when BL=8.

The operation shown in FIG. 14 is similar to that shown in FIG. 13 except that the DQS pass signal dqs_pass is disabled by using the second burst mode enable signal ybst instead of the first burst mode enable signal caspwt_L. In case of BL=8, the output of the NAND gate ND3 of the burst length detecting unit changes to generate the DQS stop signal dqs_stop and, in turn, the DQS pass signal dqs_pass is enabled by the DQS stop signal dqs_stop.

As shown in FIG. 13 or 14, the reason of using the DQS sustain signal caspwt_L is to guarantee the operation of the memory device in the gapless state(the state where the read or write commands are successively performed) or the interrupt state(the state where the device is operated by other command immediately after 4 data are inputted in write operation when BL=8in the DDR II specification). That is, in the memory device of the present invention, the DQS stop signal is not generated while the DQS sustain signal caspwt_L is in the high level.

Figure 15:
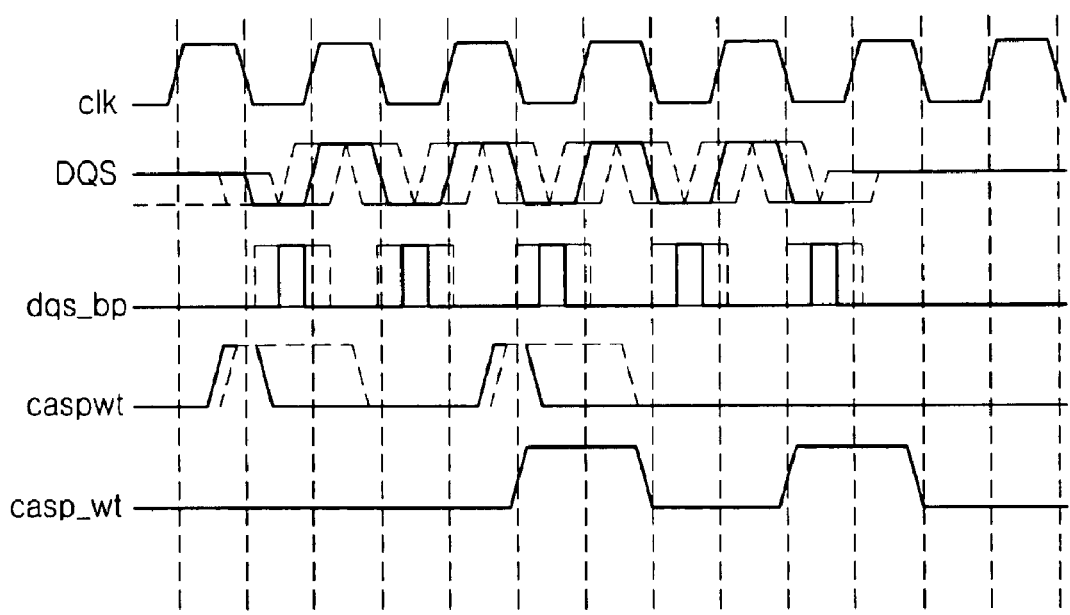
FIG. 15 illustrates a waveform diagram for explaining operation of a memory device of the present invention according to input margin of a DQS signal.

FIG. 15 illustrates a waveform diagram for explaining operation of a memory device in accordance with the present invention with input margin of a DQS signal.

In the memory device, the data strobe signal that is inputted at the timing of data input after receiving the write command is inputted having a margin of (WL−0.25)×tCK−(WL+0.25)×tCK. Here, WL means a write latency that is the timing from the write command input to the data input.

Accordingly, the data strobe signal DQS that is inputted at the timing of the data input is inputted having its margin about 0.5 tCK. That is, if WL=1, during the operation of the memory device, the data strobe signal DQS can be inputted sometimes at 0.75×tCK after the write command input or sometimes at 1.75×tCK after the write command input.

Figure 5:
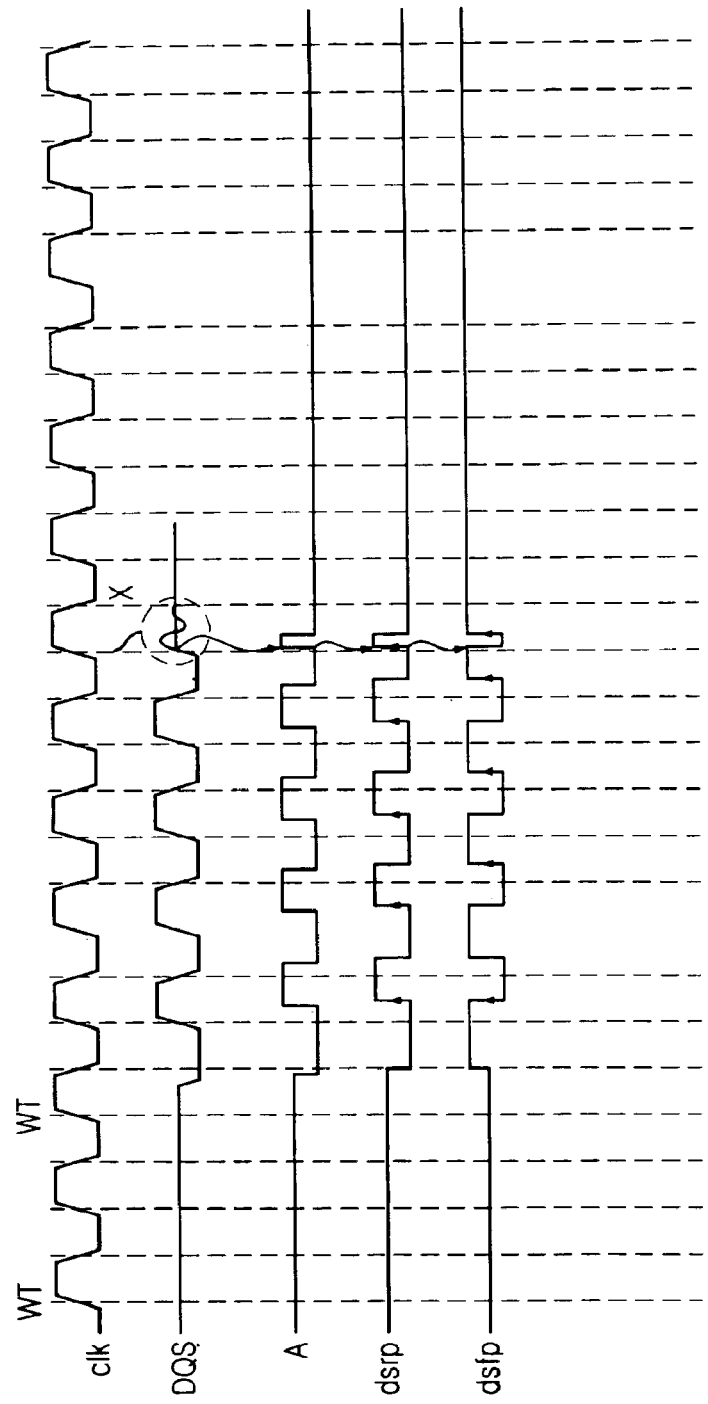
FIG. 5 represents a waveform diagram for explaining the shortage of the memory device shown in FIG. 1.

Referring back to FIG. 5, even considering the input margin of the tDQS, the circuit of the present invention shows no problem.

As describe above, the erroneous operation due to the ripple of the DQS signal in the write operation of the synchronous memory device can be prevented according to the present invention so that stable operation of the memory device can be guaranteed. Further, the signals that are used in the present invention are all basically required signals in the DDR II specification, requesting no additional circuit area.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A synchronous memory device receiving a number of data synchronous with a rising edge and a falling edge of an operation clock, comprising:
    data strobe buffering means for outputting a rising pulse and a falling pulse for detecting a rising edge and a falling edge of a DQS signal that sustains high impedance state when there is no operation and is clocked while the data is inputted;
    data align latching means for latching and aligning the data synchronous with the rising pulse and the falling pulse; and
    DQS signal controlling means for controlling the data strobe buffering means to output the rising pulse and the falling pulse to the data align latching unit only when the DQS signal is clocked.

2. The synchronous memory device as recited in claim 1, wherein the data strobe buffering means includes:
    differential amplifying means for receiving the DQS signal and a reference voltage;
    first buffering means enabled by a DQS pass signal that is outputted from the DQS signal controlling unit for buffering and outputting the output signal of the differential amplifying means;
    second buffering means for buffering the output of the first buffering means to output the rising pulse; and
    third buffering means for buffering the output of the first buffering means to output the falling pulse.

3. The synchronous memory device as recited in claim 2, wherein the differential amplifying means includes:
    a first and a second MOS transistors for receiving the reference voltage and the DQS signal at their gates, respectively;
    a third diode-type MOS transistor coupled to a power voltage VDD and one end of the first MOS transistor, the gate of the third diode-type MOS transistor being coupled to the one end of the first MOS transistor;
    a fourth MOS transistor coupled to the power voltage VDD and the one end of the second MOS transistor, the gate of the fourth MOS transistor being coupled to the gate of the third MOS transistor to form a current mirror; and
    a fifth MOS transistor for connecting the commonly coupled other end of each of the first and the second MOS transistors to the ground voltage, and receiving, at its gate, the DQS enable signal that is generated by a write command.

4. The synchronous memory device as recited in claim 3, wherein the first buffering means includes:
    a NAND gate for receiving the one end of the second MOS transistor and the DQS pass signal that is outputted from the DQS signal controlling means; and
    a first and a second inverters, serially coupled to each other, for buffering and outputting the output of the NAND gate.

5. The synchronous memory device as recited in claim 4, wherein the second buffering means includes:
    a third inverter for outputting the inverted output of the second inverter; and
    a fourth inverter for outputting the inverted output of the third inverter as the rising pulse.

6. The synchronous memory device as recited in claim 5, wherein the third buffering means includes:
    a fifth inverter for outputting the inverted output of the second inverter;
    a sixth inverter for outputting the inverted output of the fifth inverter; and
    a seventh inverter for outputting the inverted output of the sixth inverter as the falling pulse.

7. The synchronous memory device as recited in claim 2, wherein the DQS signal controlling means includes:
    DQS signal disabling means for outputting a DQS stop signal in the post-amble state of the DQS signal for stopping outputting of the DQS signal; and
    DQS pass signal generating means for enabling the DQS pass signal with a preamble pulse signal that is generated during the preamble period of the DQS signal, and disabling the DQS pass signal in response to the DQS stop signal.

8. The synchronous memory device as recited in claim 7, wherein the DQS pass signal generating means includes:

DQS state detecting means enabled by the DQS enable signal that is generated by the write command for changing the output to a first level in response to the preamble pulse signal that is generated in the preamble state of the DQS signal and changing the output to a second level in response to the DQS stop signal; and DQS pass signal outputting means for latching and outputting the signal level of the output of the DQS state detecting means.

9. The synchronous memory device as recited in claim 8, wherein the DQS state detecting means includes:

a first MOS transistor receiving the DQS stop signal at its gate, one end of the first MOS transistor being coupled to the power voltage;

a second MOS transistor receiving the preamble pulse signal at its gate, one end of the second MOS transistor being coupled to the other end of the first MOS transistor;

a third MOS transistor receiving the preamble pulse signal at its gate, one end of the third MOS transistor being coupled to the other end of the second MOS transistor;

a fourth MOS transistor receiving the DQS enable signal at its gate, one end of the fourth MOS transistor being coupled to the other end of the third MOS transistor and the other end of the fourth MOS transistor being coupled to the ground voltage; and a fifth MOS transistor receiving the DQS enable signal at its gate and connecting the power voltage to the common node of the second MOS transistor and the third MOS transistor.

10. The synchronous memory device as recited in claim 9, wherein the DQS pass signal outputting means includes:

a first inverter, its input being coupled to the power voltage and the common node of the second MOS transistor and the third MOS transistor;

a second inverter, its input and its output being coupled to the input and the output of the first inverter, respectively;

a third inverter for outputting the inverted output of the second inverter; and a fourth inverter for outputting the inverted output of the third inverter as the DQS pass signal.

11. The synchronous memory device as recited in claim 7, wherein the DQS signal disabling means includes:

burst length detecting means for outputting a burst length signal that is enabled at the timing when the last data among a number of inputted data is inputted in a burst length mode;

DQS pulse generating means for outputting a DQS pulse signal that is generated as a pulse at every timing when the DQS signal is clocked; and DQS stop signal generating means for outputting the DQS stop signal by using the DQS pulse signal that is inputted while the burst length signal is enabled.

12. The synchronous memory device as recited in claim 11, wherein the DQS stop signal generating means includes:

a first NAND gate receiving the burst length signal and the DQS pulse signal;

a first NOR gate receiving the output of the first NAND gate and a DQS sustain signal that has the high level during an interrupt mode and a gapless mode; and a first inverter for inverting the output of the first NOR gate to output the DQS stop signal.

13. The synchronous memory device as recited in claim 12, wherein the burst length detecting means includes:

a second NAND gate receiving a first burst length signal that sustains the enable state when the burst length mode is '4' and a first burst mode enable signal that is enabled at the timing when the fourth data is inputted during the period when the burst length mode is '4';

a third NAND gate receiving a second burst length signal that sustains the enable state when the burst length mode is '8' and a second burst mode enable signal that is enabled at the timing when the eighth data is inputted during the period when the burst length mode is '8'; and a fourth NAND gate receiving the outputs of the second NAND gate and the third NAND gate to output the burst length signal.

14. The synchronous memory device as recited in claim 13, wherein the DQS pulse generating means include:

a second inverter for outputting the inverted output of the first buffering means;

a third and a fourth inverter serially coupled to each other for buffering the output of the second inverter; and a second NOR gate receiving the output of the first buffering means and the output of the fourth inverter to output the DQS pulse signal.

15. The synchronous memory device as recited in claim 1, wherein the DQS buffering means and the DQS signal controlling means are enabled by the DQS enable signal that is generated by a write command.

* * * * *